(12) United States Patent
Zang

(10) Patent No.: US 9,905,661 B2
(45) Date of Patent: Feb. 27, 2018

(54) SEMICONDUCTOR STRUCTURE HAVING SOURCE/DRAIN GOUGING IMMUNITY

(71) Applicant: GLOBALFOUNDRIES Inc., Grand Cayman (KY)

(72) Inventor: Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 20 days.

(21) Appl. No.: 15/185,801

(22) Filed: Jun. 17, 2016

(65) Prior Publication Data

US 2016/0293715 A1 Oct. 6, 2016

Related U.S. Application Data

(63) Continuation of application No. 14/609,271, filed on Jan. 29, 2015, now Pat. No. 9,412,659.

(51) Int. Cl.
| | | |
|---|---|---|
| H01L 29/76 | (2006.01) | |
| H01L 29/417 | (2006.01) | |
| H01L 21/768 | (2006.01) | |
| H01L 23/535 | (2006.01) | |
| H01L 21/28 | (2006.01) | |
| H01L 21/8234 | (2006.01) | |
| H01L 27/088 | (2006.01) | |
| H01L 29/49 | (2006.01) | |
| H01L 21/285 | (2006.01) | |
| H01L 29/66 | (2006.01) | |

(52) U.S. Cl.
CPC ........ *H01L 29/41725* (2013.01); *H01L 21/28* (2013.01); *H01L 21/28568* (2013.01); *H01L 21/7682* (2013.01); *H01L 21/76802* (2013.01); *H01L 21/76877* (2013.01); *H01L 21/76897* (2013.01); *H01L 21/823418* (2013.01); *H01L 21/823475* (2013.01); *H01L 23/535* (2013.01); *H01L 27/088* (2013.01); *H01L 29/4991* (2013.01); *H01L 21/823425* (2013.01); *H01L 21/823468* (2013.01); *H01L 29/6653* (2013.01); *H01L 29/6656* (2013.01); *H01L 29/66545* (2013.01); *H01L 29/66628* (2013.01)

(58) Field of Classification Search
CPC ................................ H01L 21/76897
USPC ....................................... 257/213
See application file for complete search history.

(56) References Cited

U.S. PATENT DOCUMENTS

| | | | | |
|---|---|---|---|---|
| 2008/0268640 A1* | 10/2008 | Fang | ................ | H01L 21/76834 438/672 |
| 2009/0203182 A1* | 8/2009 | Lee | .................. | H01L 21/28052 438/305 |
| 2011/0248355 A1 | 10/2011 | Futase | | |

(Continued)

*Primary Examiner* — David Vu
*Assistant Examiner* — Brandon Fox
(74) *Attorney, Agent, or Firm* — Heslin Rothenberg Farley & Mesiti P.C.; Stephen Scuderi

(57) ABSTRACT

There is set forth herein a method of fabricating a semiconductor structure, the method including forming a conductive metal layer over a source/drain region. The conductive metal layer in one aspect can prevent gouging of a source/drain region during removal of materials above a source/drain region. The conductive metal layer in one aspect can be used to pattern an air spacer for reduced parasitic capacitance. The conductive metal layer in one aspect can reduce a contact resistance between a source/drain region and a contact above a source/drain region.

9 Claims, 9 Drawing Sheets

(56) References Cited

U.S. PATENT DOCUMENTS

2012/0146106 A1 6/2012 Richter et al.
2014/0306291 A1 10/2014 Alptekin et al.
2015/0091089 A1* 4/2015 Niebojewski ....... H01L 29/0843
257/347

* cited by examiner

SEMICONDUCTOR STRUCTURE HAVING SOURCE/DRAIN GOUGING IMMUNITY

CROSS REFERENCE TO RELATED APPLICATIONS

This application is a continuation application of U.S. patent application Ser. No. 14/609,271, filed Jan. 29, 2015, and entitled "SEMICONDUCTOR STRUCTURE HAVING SOURCE/DRAIN GOUGING IMMUNITY," the entirety of which is hereby incorporated herein by reference.

TECHNICAL FIELD

The present invention relates to semiconductor structure, and more particular a semiconductor structure having source/drain gouging immunity.

BACKGROUND

Different semiconductor structures may be fabricated to have one or more different device characteristics, such as switching speed, leakage power consumption, etc. Multiple different designs may each provide optimization of one or more of these characteristics for devices intended to perform specific functions. For instance, one design may increase switching speed for devices providing computational logic functions, and another design may decrease power consumption for devices providing memory storage functions. A system using multiple discrete devices optimized for different functions presents challenges in terms of system complexity, system footprint and cost.

One factor affecting performance of a semiconductor circuit is a quality of a source/drain region. Another factor affecting performance of a semiconductor circuit is parasitic capacitance including parasitic capacitance attributable to conductive gate layers. Another factor affecting performance of a semiconductor circuit is a resistance between a contact and a source/drain region. Another factor affecting performance of a semiconductor circuit is parasitic capacitance which can be attributable in part, e.g. to conductive gate material.

BRIEF DESCRIPTION

There is set forth herein a method of fabricating a semiconductor structure, the method including forming a conductive metal layer over a source/drain region. The conductive metal layer in one aspect can prevent gouging of a source/drain region during removal of materials above a source/drain region. The conductive metal layer in one aspect can reduce a contact resistance between a source/drain region and a contact above a source/drain region. The conductive metal layer in one aspect can be used to pattern an air spacer to reduce parasitic capacitance.

BRIEF DESCRIPTION OF THE SEVERAL VIEWS OF THE DRAWINGS

One or more aspects as set forth herein are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
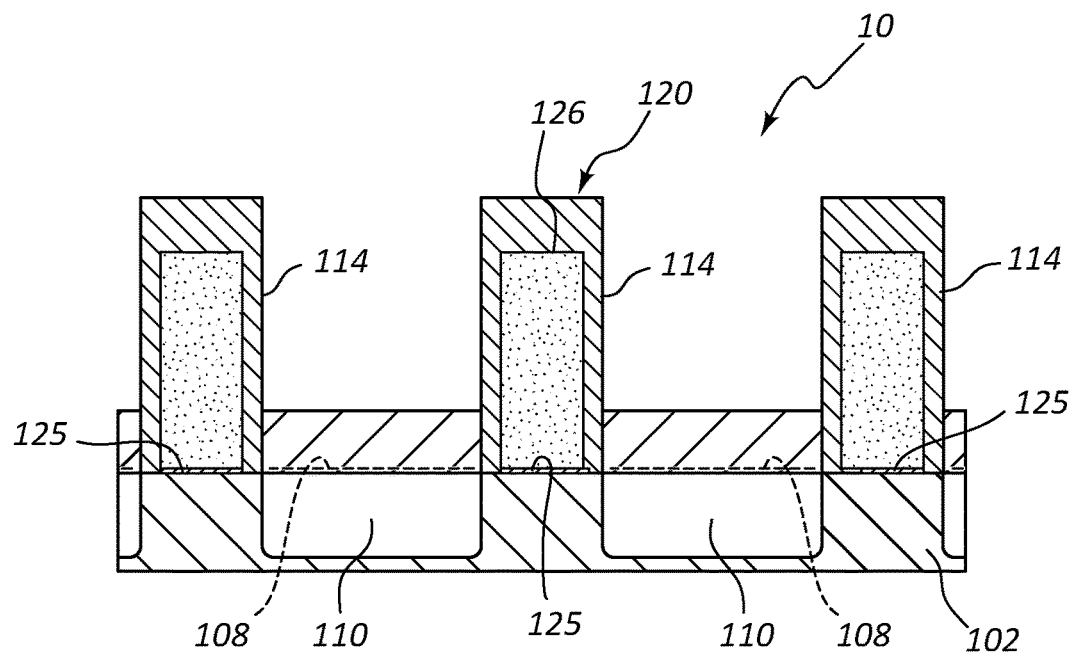
FIG. 1 is a cross sectional view of a semiconductor structure in an intermediary stage of fabrication.

Referring to FIG. 1, FIG. 1 is a top view of a semiconductor structure 10 having various regions. Semiconductor structure 10 can have various break regions between active regions, e.g., referring to FIG. 1, region a can be a sidewall to sidewall break region. Region b can be a double diffusion region and region c can be a single diffusion break region. Semiconductor structure 10 can have various active regions a, b, c, and d. Sidewall to Sidewall break region a can be provided to establish separation and isolation between sets of regions. Sidewall to sidewall break region a can extend length wise with a direction of FINS.

12—a double diffusion break region b can be provide to establish separation between active regions that have opposite plurality, e.g., regions c and region d as shown in FIG. 1. In one embodiment region c can be a PFAT region and region d can be an NFAT region. In another embodiment region c can be an NFAT region and region d can be a PFAT region. Regarding region c as shown in FIG. 1 region c single diffusion break region c can be provide to establish separation between active regions of common plurality, in one example, region b can be an n region and region a can be an n region in another example, region b can be a p region, PFAT region and region a can be also be a PFAT region.

A method for fabrication of a semiconductor structure 10 is shown, is described with reference to the flow diagram of FIG. 2. At Block 20, trenches can be formed in a sidewall to sidewall break region and in a double diffusion break region. At Block 24, trenches in an SSBR and in a DDBR can be filled. At Block 28, there can be formed a trench in a single diffusion break region SDBR. At Block 32, the SDBR region trench can be filled. At Block 36, there can be preformed recessing of trenches.

Further aspects of the noted processing blocks are described to reference to FIGS. 3-15.

Figure 3:
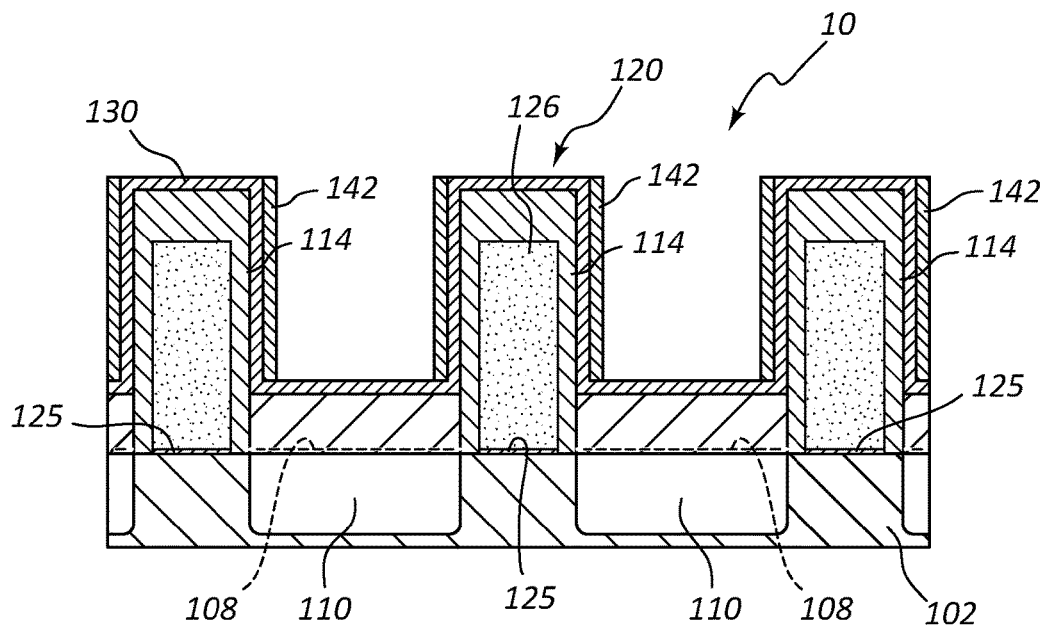
FIG. 3 is a cross sectional view of a semiconductor structure in an intermediary stage of fabrication after formation of wing spacers.

Referring to FIG. 3 is a FIN with wide view of a semiconductor structure 10.

Figure 2:
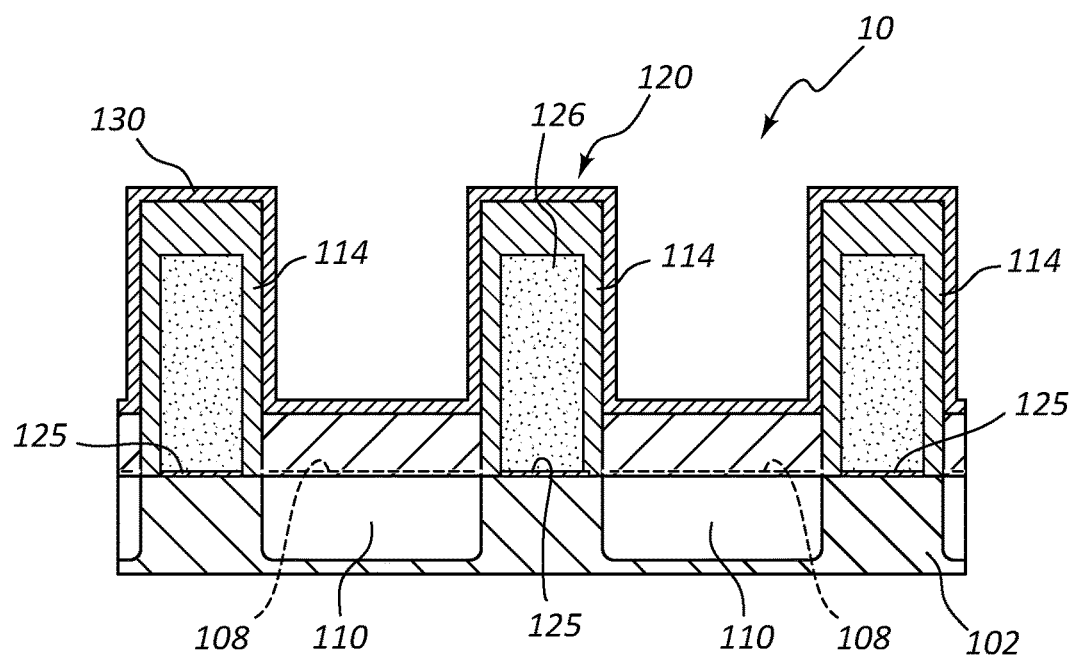
FIG. 2 is a cross sectional view of a semiconductor structure in an intermediary stage of fabrication after formation of a conductive metal layer.

Referring to FIG. 2, FIG. 2 illustrated a method for use in fabricating shallow trench isolation features in semiconductor structure 10. At Block, referring to a method for fabrication of isolation trench formations at Block 204 an isolation trench in a sidewall to sidewall break region (SSBR) can be formed with a common etch process with a trench in an double diffusion break region (DDBR). At Block 208, trenches defined at Block 204 can be filled with a suitable dielectric material e.g., an oxide. At Block 212 there can be formed a trench in a single diffusion break region (SDBR). At Block 216, the trench defined at Block 212 can be filled with a suitable dielectric material, e.g., an oxide. At Block 220 there can be formed recess seeing of material filled in the trenches at Block 208 and at Block 216.

Referring to FIG. 3, FIG. 3 is a cross sectional view taken along line a-a to a-a of FIG. 1. FIG. 3 is a FIN with wide view illustrating aspects of fabrication of a trench with an SSBR A (Region A). Referring to FIG. 3, semiconductor structure 10 in the cross section shown can include a substrate 102 having a thin section 12 and a main body portion 11. Above a top elevation of FIN section 12 of each FIN, 12 there can be formed an etch stop layer 14.

Figure 4:
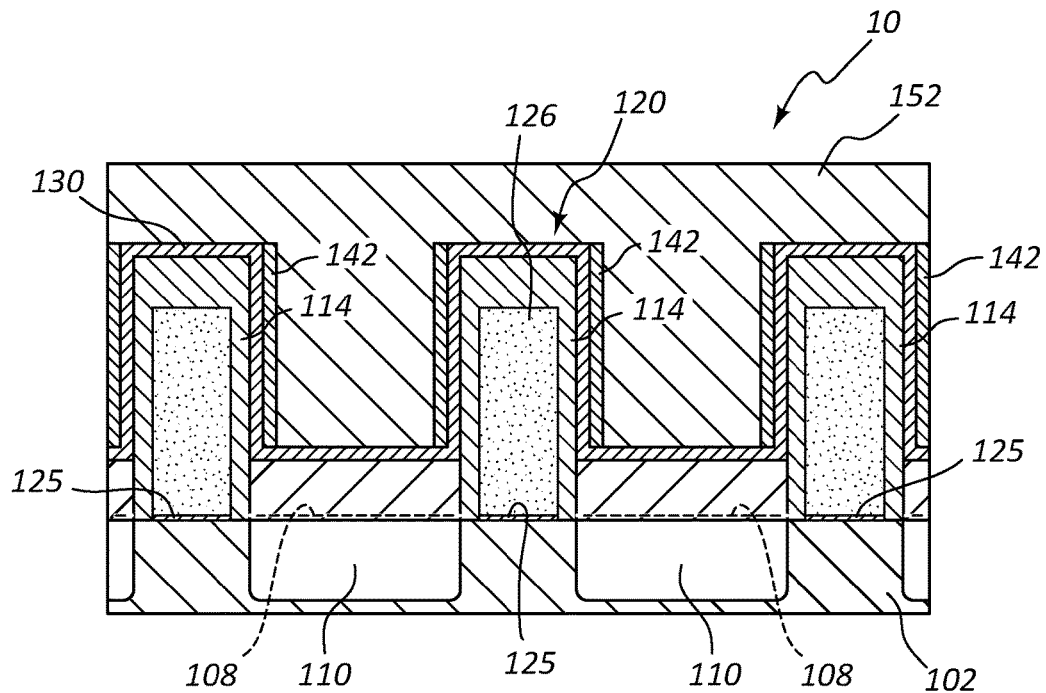
FIG. 4 is a cross sectional view of a semiconductor structure in an intermediary stage of fabrication after formation of a layer which can include oxide.

Referring to FIG. 4, FIG. 4 illustrates semiconductor structure 10 as shown in FIG. 3 after formation of layer 16 which can be provided by dielectric material, e.g., an oxide and layer 18 which can be formed of photoresist material. Referring to FIG. 4, layer 16 and layer 18, referring to FIG. 4 layer 18 can be provide to—can be patterned as a mask for use in patterning trenches in SSBR (region a).

Figure 5:
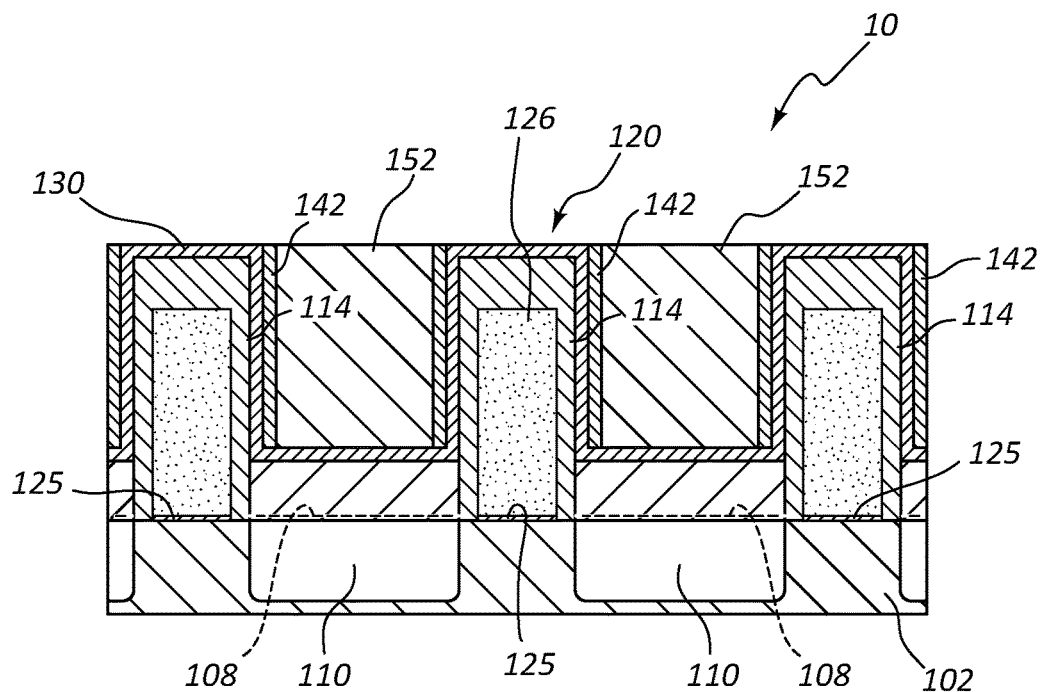
FIG. 5 is a cross sectional view of a semiconductor structure in an intermediary stage of fabrication after planarization of the semiconductor structure shown in FIG. 4.

Referring to FIG. 5, FIG. 5 illustrated semiconductor structure 10 after removal of a section of material for layer 16, layer 14, layer 12 and layer 11. In FIG. 5, there is illustrated a trench 22 extending below a top elevation of mail body section 11 of substrate 102. With the formation of trench at region a of semiconductor structure 10 there can be formed trench 24 at region b of semiconductor structure 10.

Referring again to FIG. 1, region b of semiconductor structure 10 is a double diffusion break region DDBR.

Figure 6:
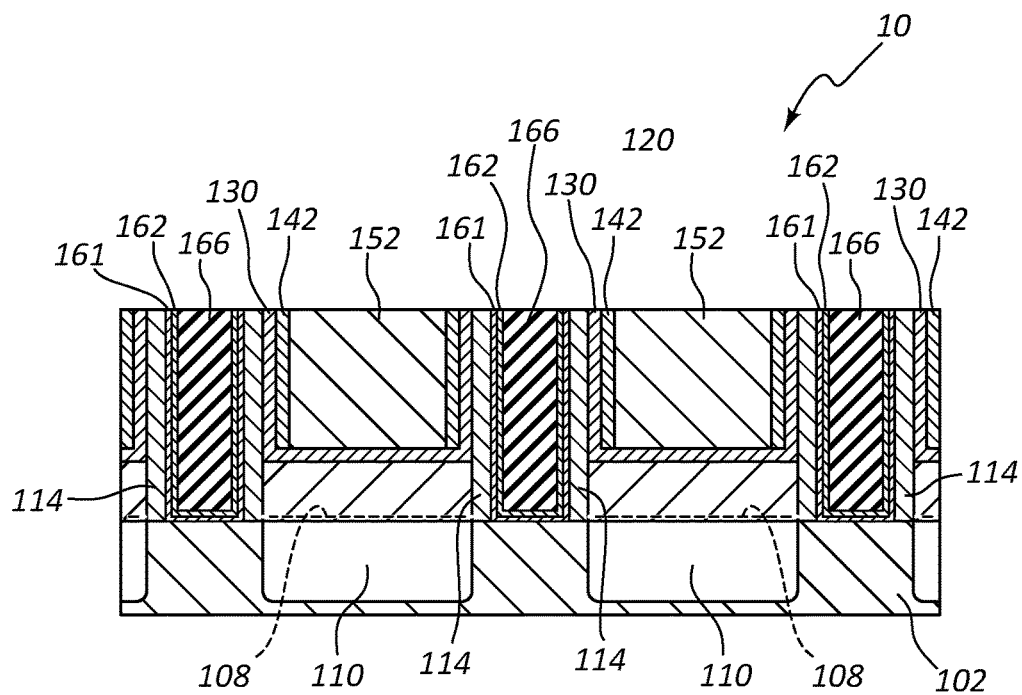
FIG. 6 is a cross sectional view of a semiconductor structure in an intermediary stage of fabrication after formation of gate layers.

FIG. 6 illustrates formation of trench 24 simultaneously with formation of trench 22 in region a.

Referring to FIG. 6, FIG. 6 is a cross sectional view taken along line b-b of FIG. 1, i.e., rotated 900 relative to cross sectional view of FIG. 5. With further reference to the cross sectional view of FIG. 6, mask 18 or layer 18 which can include photoresist material shown in another area in FIG. 4 can be patterned for patterning of trench 24.

Figure 7:
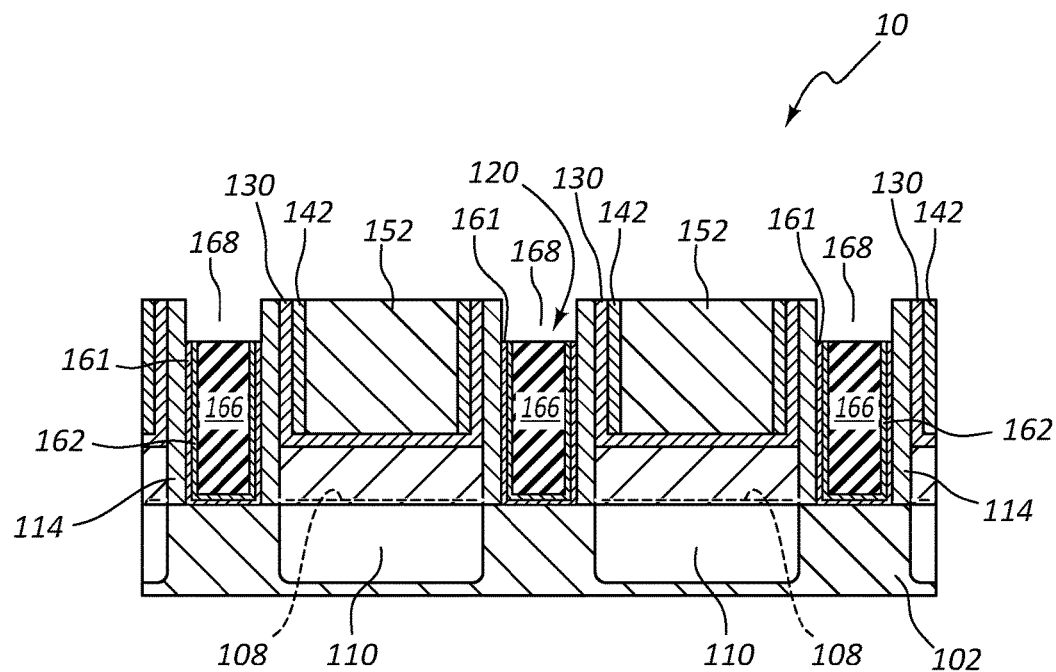
FIG. 7 is a cross sectional view of a semiconductor structure in an intermediary stage of fabrication after removal of material from a gate.

Referring to FIG. 7, FIG. 7 illustrated semiconductor structure 10 as shown in FIG. 5 after formation of layer 28 which can be an oxide layer.

Figure 8:
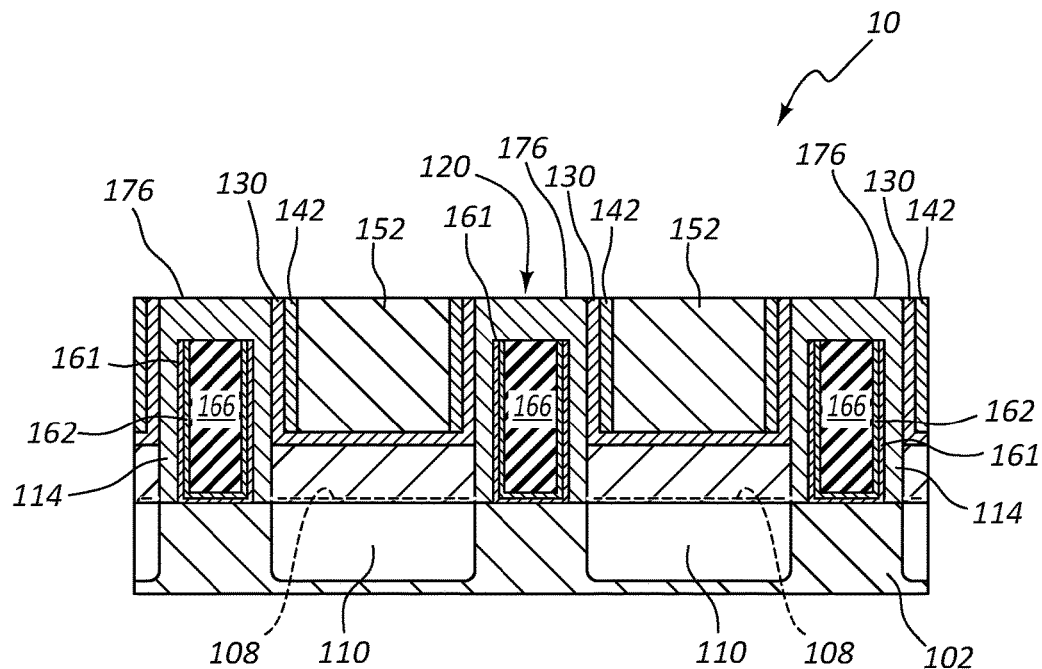
FIG. 8 is a cross sectional view of a semiconductor structure in an intermediary stage of fabrication after formation of a layer that can include a dielectric material.

Referring to FIG. 8, FIG. 8 is a cross sectional view illustrating the semiconductor structure 10 as shown in FIG. 7 after planar zing of semiconductor structure 10.

Figure 9:
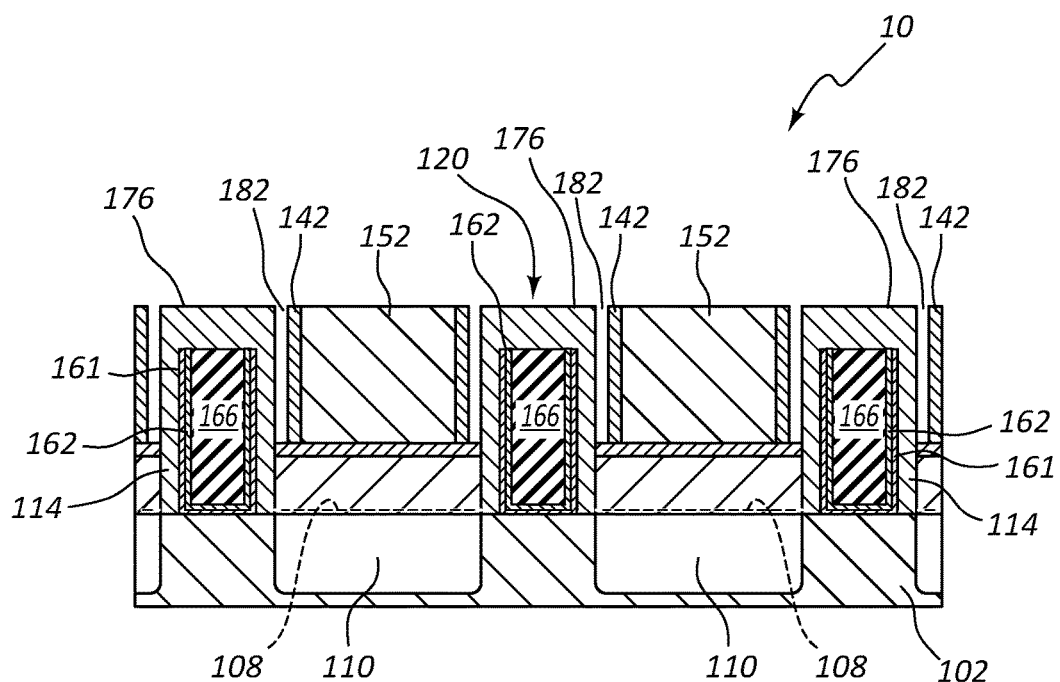
FIG. 9 is a cross sectional view of a semiconductor structure in an intermediary stage of fabrication after removal of material to define air spacers.
Figure 10:
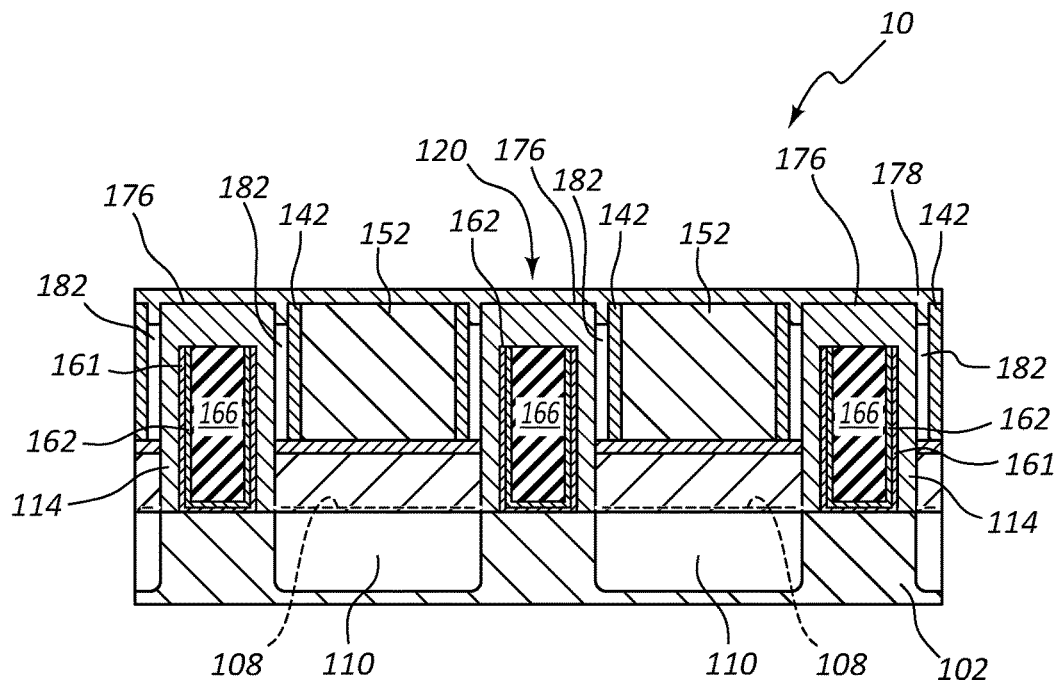
FIG. 10 is a cross sectional view of a semiconductor structure in an intermediary stage of fabrication after formation of a layer that can include oxide.

Referring to FIG. 9, FIG. 9 is a cross sectional view of semiconductor structure 10 as shown in FIG. 8 after formation of layer 32. Layer 32 can be a masking layer and can be formed of photoresist material. Layer 32 can be used for patterning a trench in region c, DDB Referring to FIG. 10, FIG. 10 is a cross sectional view taken along c-c of FIG. 1 and illustrates formation of trench 26 within SDBR (region c). Referring to FIG. 10, layer 32 as shown in FIG. 9 can include a pattern area for use in patterning trench 26.

Figure 11:
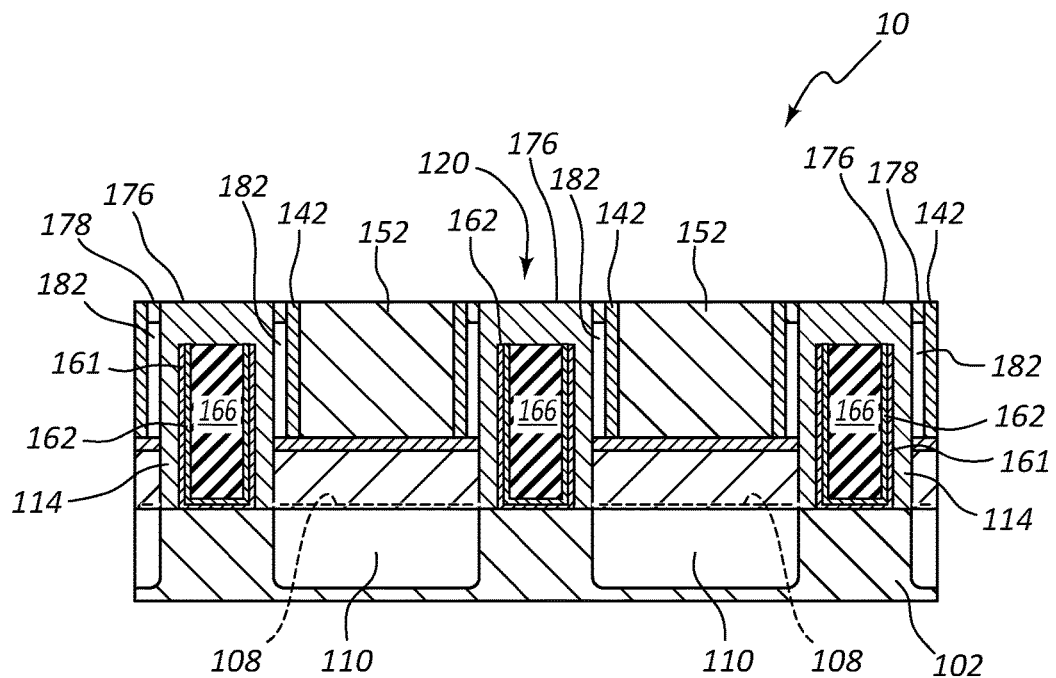
FIG. 11 is a cross sectional view of a semiconductor structure in an intermediary stage of fabrication after removal of material of the semiconductor structure depicted in FIG. 10.

Referring to FIG. 11, FIG. 11 illustrates the semiconductor structure 10 as shown in FIG. 10 after processing for pull back and enlarging of trench 26. Referring to FIG. 11, layer 32 can be subject to etching; on being subject to etching layer 32 can be reduced in elevation slightly and width of trench 26 through layer 32 can be widened.

Figure 12:
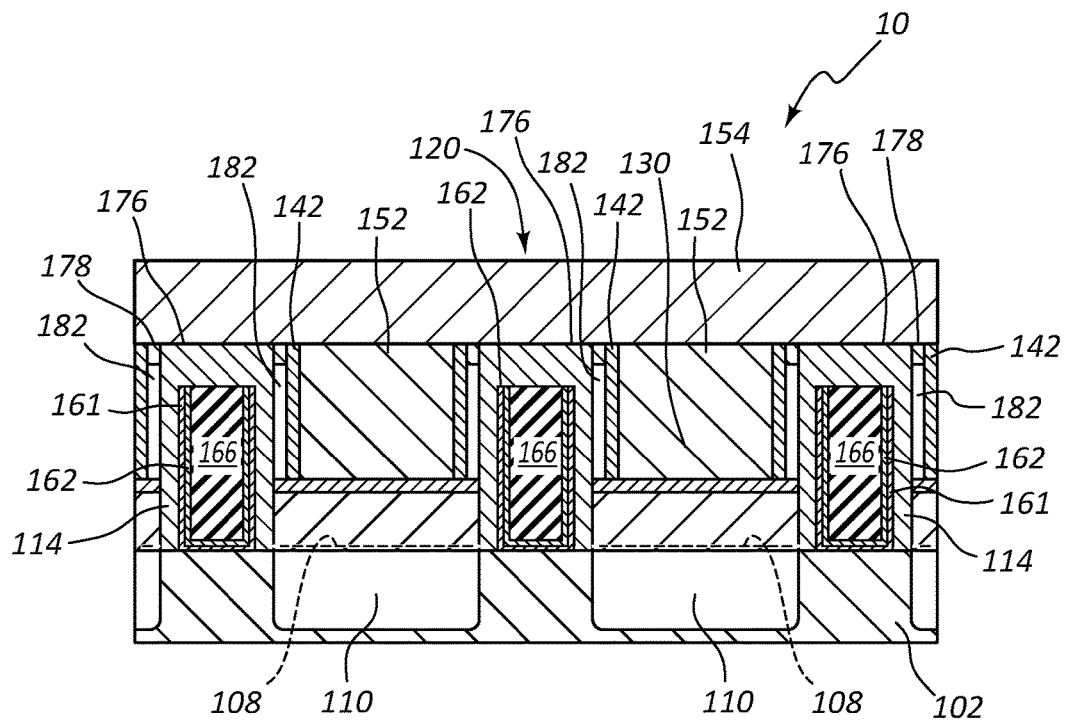
FIG. 12 is a cross sectional view of a semiconductor structure in an intermediary stage of fabrication after formation of a layer that can include oxide.

Referring to FIG. 12, FIG. 12 illustrates the semiconductor structure 10 as shown in FIG. 11 after formation of, after depositing of formation 36 in trench 26 and after planarization of semiconductor structure 10. Referring further to FIG. 12 formation 36 can be provided by an oxide material, e.g., can be provided by a dielectric material, e.g., an oxide and can be formed to be T shaped as shown in FIG. 12.

Figure 13:
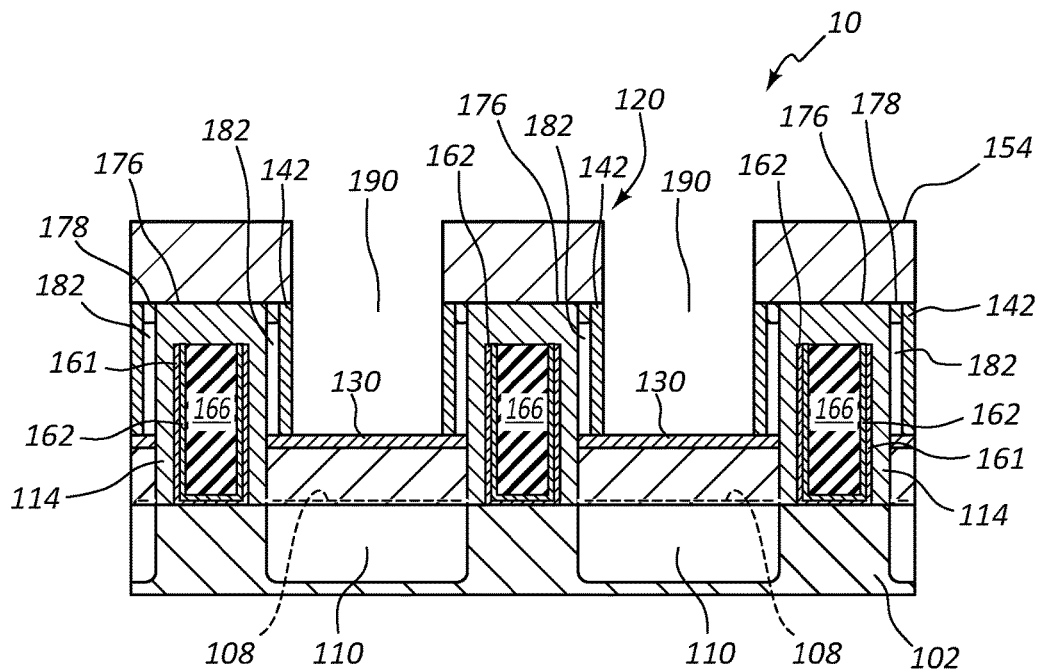
FIG. 13 is a cross sectional view of a semiconductor structure in an intermediary stage of fabrication after removal of material to define a contact hole.

Referring to FIG. 13, FIG. 13 illustrates semiconductor structure 10 as shown in FIG. 12 after removal of layer 32 which can be a masking layer.

Figure 14:
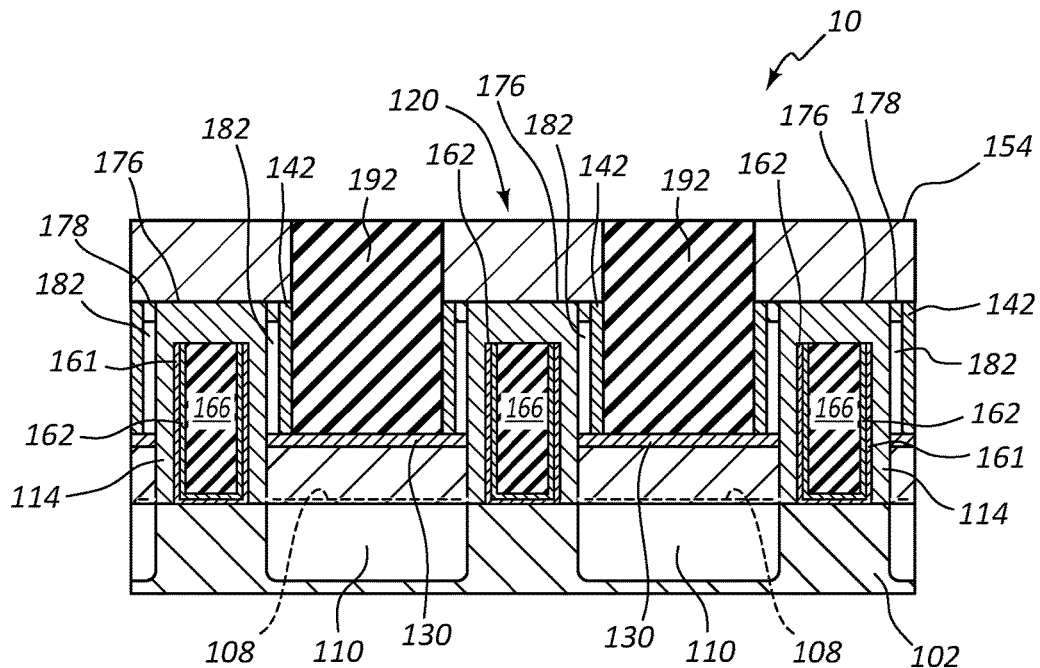
FIG. 14 is a cross sectional view of a semiconductor structure in an intermediary stage of fabrication after formation of material within contact holes.
Figure 15:
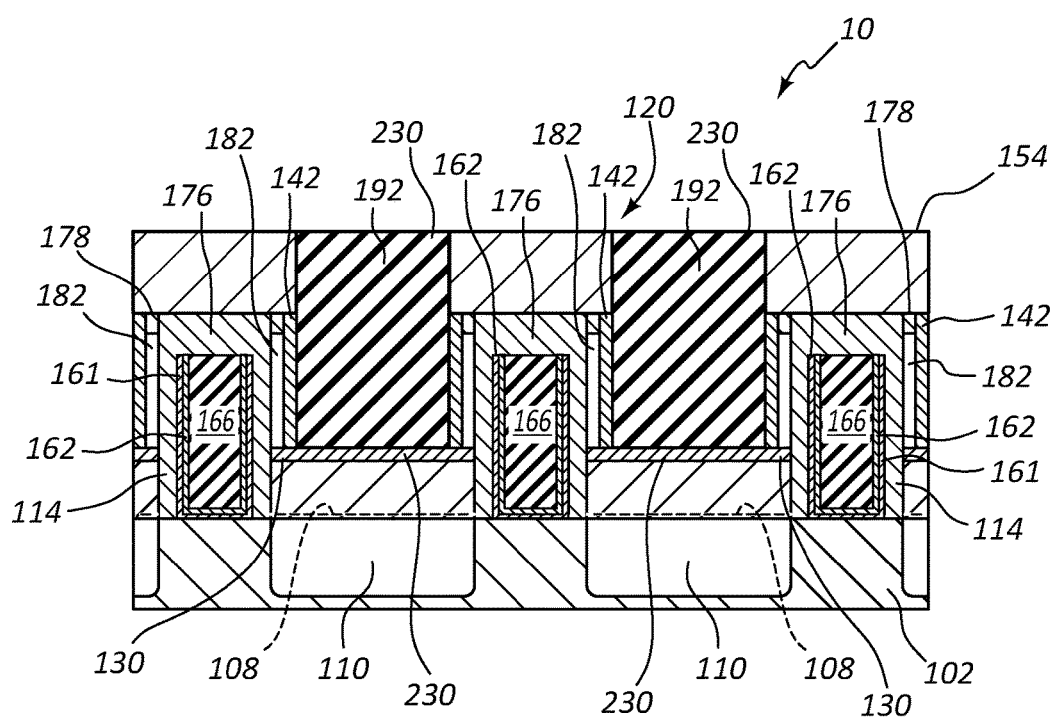
FIG. 15 is a cross sectional view of a semiconductor structure in an intermediary stage of fabrication after formation of material within contact holes.
Figure 16:
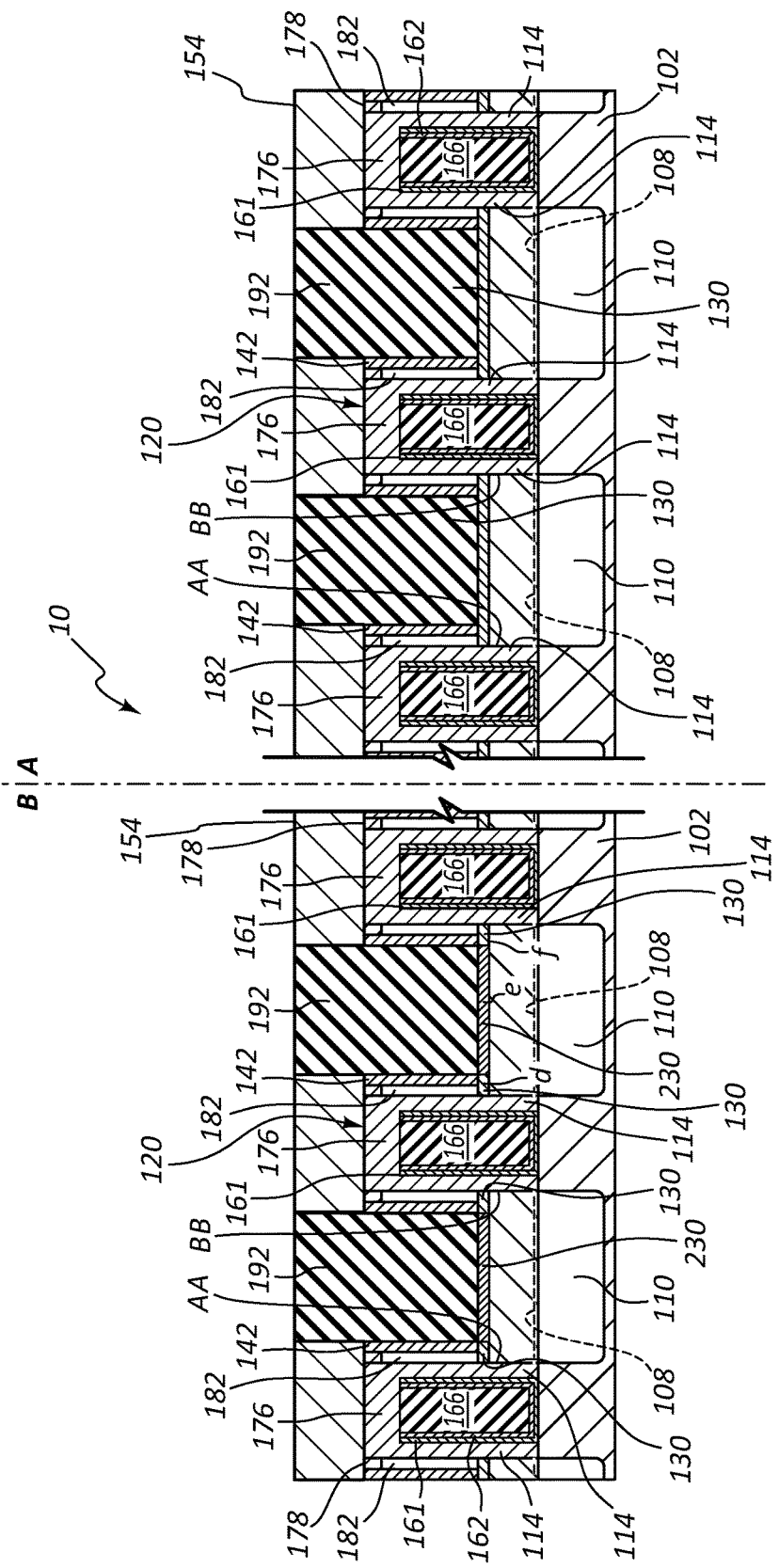
FIG. 16 is a cross sectional view of a semiconductor structure in an intermediary stage of fabrication after formation of first and second regions having different contact configurations.

Referring to FIGS. 14, 15, and 16 FIGS. 14, 15, and 16 illustrates various regions of semiconductor structure 10 after removal of section of an oxide formation formed in a trench of the particular region. Referring to FIG. 14, FIG. 14 illustrates reduction, illustrates removal of a section of formation 36 which can be an oxide formation within region c. Referring to FIG. 15, FIG. 15 illustrates removal of a section of oxide within a section dielectric material within trench 24. Referring to FIG. 16, FIG. 16 illustrates removal of a section of oxide formation 28 within trench 22. FIG. 14 is a cross sectional view taken along line c-c of FIG. 1. FIG. 15 is a cross sectional view taken along line b-b of FIG. 1. FIG. 16 is a cross sectional view taken along line a-a of FIG. 1. It is seen that with the described processing and with removal of a portion of oxide at Block 220 (FIG. 2) an level of an oxide formation can be reduced to a elevation below a top elevation of trench 24 and trench 27 however, referring to FIG. 14, removal of dielectric material al Block 220 (FIG. 2) can result in an elevation of oxide formation 36 as shown in FIG. 14 remaining above a top elevation of trench 26 that is filled by oxide formation 36.

Referring to FIGS. 3-16 it is seen that a shallow trench isolation architecture can be achieved in which SDB region c has a oxide formation above a top trench elevation level and wherein DDB region b as shown in FIG. 15 and wherein SSB region a as shown in FIG. 16 have oxide elevations below a top elevation of their respected trenches. With use of first and second mask, namely layer 18 (FIG. 4 and FIG. 6) used for formation of trench 22 and trench 24 and mask 32 use for formation of trench 26 within SDB region c.

Referring to FIG. 17, FIG. 17 illustrates semiconductor structure 10 as shown in the cross sectional view of FIG. 14 after formation of gate 50, gate 50D, and gate 50 over a top elevation of substrate 102. Gates 50 are gates where as gate 50D is a dummy gate formed on formation 36. For formation of source/drain regions associated to gate 50 and gate 50 to each of the gates 50 substrate 102 can be recessed as shown by dotted lines 56 and then source/drain material can be expactsilly grown. It is seen that formation 36 encourages substantially symmetrically growth of epitaxially growth regions. By comparison semiconductor structure 10 fabricated without a T shaped formation 36 is illustrated in FIG. 18. In the semiconductor structure shown in FIG. 18 recessed portions of substrate may be provided along dashed lines 56A rather than along dashed lines 56 as shown in FIG. 17. Accordingly, because epitaxially grown material cannot be grown on an oxide. Source/drain regions with a structure as shown in FIG. 18 may not be symmetrically grown.

Referring to FIG. 1, FIG. 1 semiconductor structure 10 shown in an intermediate fabrication stage can include a substrate 102, source/drain region 110, gate spacers 114, dielectric layer 125, and sacrificial polysilicon gate material formations 126, semiconductor structure 10 can also include source/drain regions 110.

Below a top elevation 108 of substrate 102 in one embodiment, source/drain regions 110 can be defined by doped areas of substrate 102. Above a top elevation 108 of substrate 102 source/drain regions 110 in one embodiment can be defined by epitaxially grown formations grown using epitaxially growth processes. Where semiconductor structure 10 is of a FinFET architecture, substrate 102 can be provided by a fin of semiconductor structure. Substrate 102 can alternatively be provided by a planar layer, e.g., a bulk layer or a thin layer e.g. in the case that semiconductor structure 10 is fabricated using a silicon on insulator (SOI) wafer.

In one embodiment, substrate 102 can be selectively recessed prior to formation of epitaxially grown formations of source/drain region 110. In such an embodiment, substantially any entirety of source/drain region 110 (areas both above elevation 108 and below elevation 108) can include epitaxially grown material.

In one embodiment source/drain regions 110 can be absent epitaxially grown formations and can be entirely defined below a top elevation 108 of substrate 102. In one embodiment, spacers 114 can be formed of nitride, e.g., silicon nitride (SiN). Dielectric layer 125 can be formed e.g., of silicon dioxide, $SiO_2$.

Referring to FIG. 2, FIG. 2 illustrates the semiconductor structure 10 as shown in FIG. 1 after formation of layer 130. Layer 130 in one embodiment can be formed of metallic material. Layer 130 can be formed, e.g., of titanium (Ti), titanium nitride (TiN), tantalum nitride (TaN), titanium platinum (TiPt), cobalt (Co) or nickel platinum (NiPt). It was observed in the development of methods and apparatus herein that oxide can have improved etch selectively to metallic material relative to material of source/drain region, e.g., Si, SiGe. Accordingly, in one aspect as will be set forth herein, layer 130 can reduce a risk of gouging of source/drain region 110. In one aspect as set forth herein, layer 130 can be used to pattern air spacers. In another aspect, layer 130 can provide for a contact configuration having reduced contact resistance.

Referring to FIG. 3, FIG. 3 illustrates the semiconductor structure 10 of FIG. 2 after formation of wing spacers 142. Wing spacers 142 can be formed of a dielectric low K material such as a nitride, e.g., SiN. Wing spacers 142 can extend parallel to spacers 114 and can be separated from spacers 114 by vertically extending sections of layer 130.

Referring to FIG. 4, FIG. 4 illustrates the semiconductor structure 10 as shown in FIG. 3 after formation of layer 152. Layer 152 in one embodiment can be provided by a dielectric material, e.g., an oxide.

Referring to FIG. 5, FIG. 5 illustrates the semiconductor structure 10 as shown in FIG. 4 after planarizing of layer 152. With planarizing of layer 152 complete as shown in FIG. 5 the top elevation of layer 152 can be lowered to a top elevation of layer 130. Referring to the intermediary fabrication stage views of FIGS. 1-5, it is seen that spacers 114 of semiconductor structure 10 in the intermediary fabrication stage views of FIGS. 1-5 can define a capping area therebetween.

Referring to FIG. 6, FIG. 6 illustrates the semiconductor structure 10 as shown in FIG. 5 after completion of a replacement metal gate process. According to a replacement metal gate process sacrificial polysilicon formation 126 (FIGS. 1-5) can be replaced with conductive gate material.

For replacement of sacrificial polysilicon formation 126 an opening above polysilicon formation 126 (FIG. 5) can be formed and formations 126 can be removed. Layer 161 which can be a high K layer can be formed and then layer 162 which can be a work function metallic layer can be formed over layer 161. A metal formation 166 e.g., formed of tungsten (W) can be formed over layer 161, and then semiconductor structure 10 can be subject to chemical mechanical planarization to define a planarized semiconductor structure 10 as set forth in FIG. 6.

Gates 120 in the intermediary fabrication stage views of FIGS. 1-5 can include layer 125 formed of dielectric material, polysilicon formation 126 and spacers 114. Gates 120 in the intermediary fabrication stage views of FIGS. 6-16 can include layer 161 formed of dielectric material, layer 162 formed of a work function material and spacers 114. Dielectric layer 161 can be e.g., a high K dielectric material, e.g., $HfO_2$.

Referring to FIG. 7, FIG. 7 illustrates the semiconductor structure 10 as shown in FIG. 6 after removal of a portion of material of layer 161, layer 162, and layer 166 to define holes 168.

Referring to FIG. 8, FIG. 8 illustrates the semiconductor structure 10 as shown in FIG. 7 after forming a layer 176 within holes 168. Layer 176 can be provided by a dielectric material. Layer 176 can be formed so that layer 176 can initially overfill holes 168 and then can be planarized.

Referring to FIG. 9, FIG. 9 illustrates the semiconductor structure 10 as shown in FIG. 8 after removal of material from vertically extending sections of layer 130. Removal of vertically extending sections layer 130 can defined air spacers 182. Air spacers 182 can feature various advantages. For example, by virtue of their having a low dielectric constant, air spacers 182 can reduce a parasitic capacitance between a surface of a contact and a surface of a gate 120.

Referring to FIG. 10, FIG. 10 illustrates the semiconductor structure 10 as shown in FIG. 9 after a formation of additional layer 178 and layer 178 can be provided by dielectric material and can define a capping formation for air spacers 182.

Referring to FIG. 11, FIG. 11 illustrates the semiconductor structure 10 as shown in FIG. 10 after planarization to reduce an elevation of layer 176 and layer 178 so that a top elevation of layer 176 and a top elevation of layer 178 is co-planar with a top elevation of layer 152.

Referring to FIG. 12, FIG. 12 illustrates the semiconductor structure 10 as shown in FIG. 11 after formation of layer 154 over semiconductor structure 10. Layer 154 can be formed of dielectric material e.g., oxide and can be formed of the same material forming layer 152.

Referring to FIG. 13, FIG. 13 illustrates the semiconductor structure 10 as shown in FIG. 12 after removal of a portion of material of layer 154 to define contact holes 190. It was observed in the development of methods and apparatus herein that without layer 130, source/drain region 110 can become gouged and degraded during removal of material from layer 154. It was observed during development of methods and apparatus herein that material forming layer 154, e.g. oxide can have improved etch selectively to material of layer 130 relative to material forming source/drain region 110, e.g. Si, SiGe. Layer 130 can protect source/drain region 110 and can reduce a likelihood of gouging of source/drain region 110 during removal of material from layer 154.

Referring to FIG. 14, FIG. 14 illustrates the semiconductor structure 10 as shown in FIG. 13 after formation of conductive material formations 192 in holes 190. Formations 192 can be provided by e.g., tungsten (W) or aluminum (Al).

Further referring to FIG. 14, FIG. 14 illustrates a first process for fabricating contacts using semiconductor structure 10 as shown in the intermediary fabrication stage of FIG. 13. A second method for fabricating contacts on a semiconductor structure 10 using the semiconductor structure 10 as shown in the intermediary fabrication stage of FIG. 13 is described with reference to FIG. 15.

Referring FIG. 15, sections of layer 130 at bottom of holes 190 can be removed according to an alternate contact fabrication process. Further with reference to FIG. 15, after removal of sections of material from layer 130, layer 230 can be formed in holes 190 (FIG. 13). Layer 230 can be formed on and adjacent to layer 230 source/drain regions 110 and can be formed of a metallic material different from a metallic material forming layer 130.

The process described in reference to FIG. 15 can be used in place of the process described with reference to FIG. 14 where it is desired that a different metallic material be in contact with source/drain region 110.

Semiconductor structure 10 can be fabricated so that an n compatible material (provided by the material of first layer 130 or layer 230) is formed on source/drain regions 110 that are n type. Semiconductor structure 10 can further be fabricated so that p compatible material (provided by the material of second of layer 130 or layer 230) can be formed on source/drain regions 110 that are p type.

Referring to FIG. 16, each of the fabrication process described with reference to FIG. 14 and with reference to FIG. 15 can be performed using a single semiconductor structure 10 having a single substrate 102.

Referring to FIG. 16, semiconductor structure 10 can include region A and region B. A contact formation method described with reference to 15 can be used in region A of semiconductor structure 10 as shown in FIG. 16 and the contact formation process described with reference to 14 can be used in region B of the structure 10 as shown in FIG. 16.

In one embodiment layer 130 can be formed of n compatible material and layer 230 can be formed of p compatible material. In such an embodiment, source/drain regions 110 of region A can be n type source/drain regions, and source/drain regions 110 of region B can be p type source/drain regions.

In one embodiment layer 130 can be formed of p compatible material and layer 230 can be formed of n compatible material. In such an embodiment, source/drain regions 110 of region A can be p type source/drain regions, and source/drain regions 110 of region B can be n type source/drain regions.

An n compatible material herein can have a relatively low work function. Examples of n compatible material include, e.g., titanium (Ti), Aluminum (Al) and erbium (Er). A p compatible material herein can have a relatively high work function. Examples of p compatible material include, e.g., platinum (Pt) and nickel platinum (NiPt).

Methods set forth herein can reduce a contact resistance between a source/drain region 110 and a contact formation 192. Referring to region A and B of FIG. 16 a metallic material formation formed on source/drain region 110 can extend from a first spacer 114 of a first gate 120 at location AA to an opposing spacer 114 at location BB of a second gate 120. The providing of a metallic material formation that extends from a first spacer 114 of a first gate 120 to an opposing spacer 114 of a second gate 120 can reduce contact resistance. In region A such metallic material formation can be provided by layer 130. In region B such metallic material formation can be provided by first and second sections of layer 130 (location d and f) and a section of layer 230 (location e).

Each of the deposited layers as set forth herein, e.g., layer 114, layer 130, layer 142, layer 152, layer 162, layer 166, layer 176, layer 178, and layer 230, can be deposited using any of a variety of deposition processes, including, for example, physical vapor deposition (PVD), atomic layer deposition (ALD), chemical vapor deposition (CVD), sputtering, or other known processes, depending on the material composition of the layer.

In one example, a protective mask layer as set forth herein, e.g., a mask layers for patterning layer 142 and layer 152 and layer 130 and layer 116, layer 162, layer 166, layer 176, layer 178 and layer 154 as set forth herein may include a material such as, for example, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in semiconductor structure. For instance, a protective mask layer may be or include an organic material. For instance, flowable oxide such as, for example, a hydrogen silsesquioxane polymer, or a carbon-free silsesquioxane polymer, may be deposited by flowable chemical vapor deposition (F-CVD). In another example, a protective mask layer may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Removing material of a layer as set forth herein, e.g., layer 152, layer 162, layer 166, layer 130, layer 176, layer 178, layer 152, and layer 154 can be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material subject to removal.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    forming a conductive metal layer over a source/drain region;
    forming a dielectric layer over the conductive metal layer;
    removing material of the conductive metal layer to define a contact hole, wherein the removing includes removing material of the dielectric layer to expose the conductive metal layer within the contact hole;
    filling the contact hole with a contact metal formation;
    wherein the forming includes forming the conductive metal layer so that the conductive metal layer extends over a first gate adjacent a first end of the source/drain region and over a second gate adjacent a second end of the source/drain region, the conductive metal layer having a section extending from a first sidewall of the first gate to an opposing sidewall of the second gate.

2. The method of claim 1, wherein the forming includes forming the conductive metal layer so that the conductive metal layer extends over a first gate adjacent a first end of the source/drain region and over a second gate adjacent a second end of the source/drain region.

3. The method of claim 1, wherein the forming includes forming the conductive metal layer so that the conductive metal layer extends over a first gate adjacent a first end of the source/drain region and over a second gate adjacent a second end of the source/drain region, the conductive metal layer having a section extending from a first sidewall of the first gate to an opposing sidewall of the second gate, the conductive metal layer having a first vertically extending section extending adjacent to the first sidewall of the first gate, the conductive metal layer including a second vertically extending section adjacent to the opposing sidewall of the second gate.

4. The method of claim 1, further comprising using the conductive metal layer to pattern air spacers.

5. The method claim 3, wherein the first vertically extending section and the second vertically extending section are removed to define air spacers.

6. A semiconductor structure comprising:
    a source/drain region having a first end adjacent a first gate and a second end adjacent a second gate;
    a conductive metal layer formed on the source/drain region;
    a dielectric layer formed adjacent a side of said first or second gate and over said conductive metal layer;
    at least one air spacer adjacent said first gate or second gate patterned from the conductive metal layer; and
    a contact metal formation formed above the conductive metal layer.

7. The semiconductor structure of claim 6, wherein the conductive metal layer has a section that extends from a first sidewall of the first gate to an opposing sidewall of the second gate.

8. The semiconductor structure of claim 6, wherein the conductive metal layer is formed of a first material and a second material different from the first material.

9. The semiconductor structure of claim 6, wherein, the semiconductor structure has a first air space adjacent the first gate and a second air spacer adjacent the second gate.

* * * * *